United States Patent
Masnaghetti et al.

(10) Patent No.: US 6,570,154 B1
(45) Date of Patent: May 27, 2003

(54) SCANNING ELECTRON BEAM MICROSCOPE

(75) Inventors: Douglas K. Masnaghetti, San Jose, CA (US); Stefano E. Concina, San Jose, CA (US); Stanley S. Sun, Pleasanton, CA (US); Waiman Ng, Los Gatos, CA (US); David L. Adler, San Jose, CA (US)

(73) Assignee: KLA-Tencor Technologies Corporation, San Jose, CA (US)

( * ) Notice: Subject to any disclaimer, the term of this patent is extended or adjusted under 35 U.S.C. 154(b) by 0 days.

(21) Appl. No.: 09/786,137

(22) PCT Filed: Sep. 2, 1999

(86) PCT No.: PCT/US99/20384

§ 371 (c)(1),
(2), (4) Date: Jun. 11, 2001

(87) PCT Pub. No.: WO00/14765

PCT Pub. Date: Mar. 16, 2000

Related U.S. Application Data

(63) Continuation of application No. 09/149,767, filed on Sep. 8, 1998, now Pat. No. 6,066,849.

(51) Int. Cl.[7] .............................................. H01J 37/244
(52) U.S. Cl. ...................................................... 250/310
(58) Field of Search ................................. 250/310, 397, 250/251

(56) References Cited

U.S. PATENT DOCUMENTS 6,066,849 A  *  5/2000  Masnaghetti et al. ........ 250/310

FOREIGN PATENT DOCUMENTS

| EP | 0810629 A1 | 3/1997 |
| WO | WO 98/32153 A3 | 7/1998 |
| WO | WO 98/32153 A2 | 7/1998 |

OTHER PUBLICATIONS

Ludwig Reimer, "Scanning Electron Microscopy, Physics of Image Formation and Microanalysis," 3.5.2 Charging of Insulating Specimens, pp. 119–123.

* cited by examiner

Primary Examiner—Kiet T. Nguyen
(74) Attorney, Agent, or Firm—Beyer, Weaver & Thomas, LLP.; Mary R. Olynick, Esq.

(57) ABSTRACT

A method and apparatus for generating an image of a specimen with a scanning electron microscope (SEM) is disclosed. The SEM (200) has a source unit (202 through 220) for directing an electron beam (203) substantially towards a portion of the specimen (222), a detector (224) for detecting particles (205) that are emitted from the specimen (222), and an image generator (234 through 242) for generating the image of the specimen (222) from the emitted particles (205). The image features are controlled by conditions under which the image is generated. The specimen is scanned under a first set of conditions (252) to generate a first image during a first image phase (302, 402). The specimen is then scanned under a second set conditions (254) during a setup phase (304, 404). The second set of conditions is selected to control charge on the specimen. The specimen is then scanned under the first set of conditions (252) to generate a second image during a second image phase (306, 406). The features of the second image are controlled by the first and second sets of conditions.

20 Claims, 7 Drawing Sheets

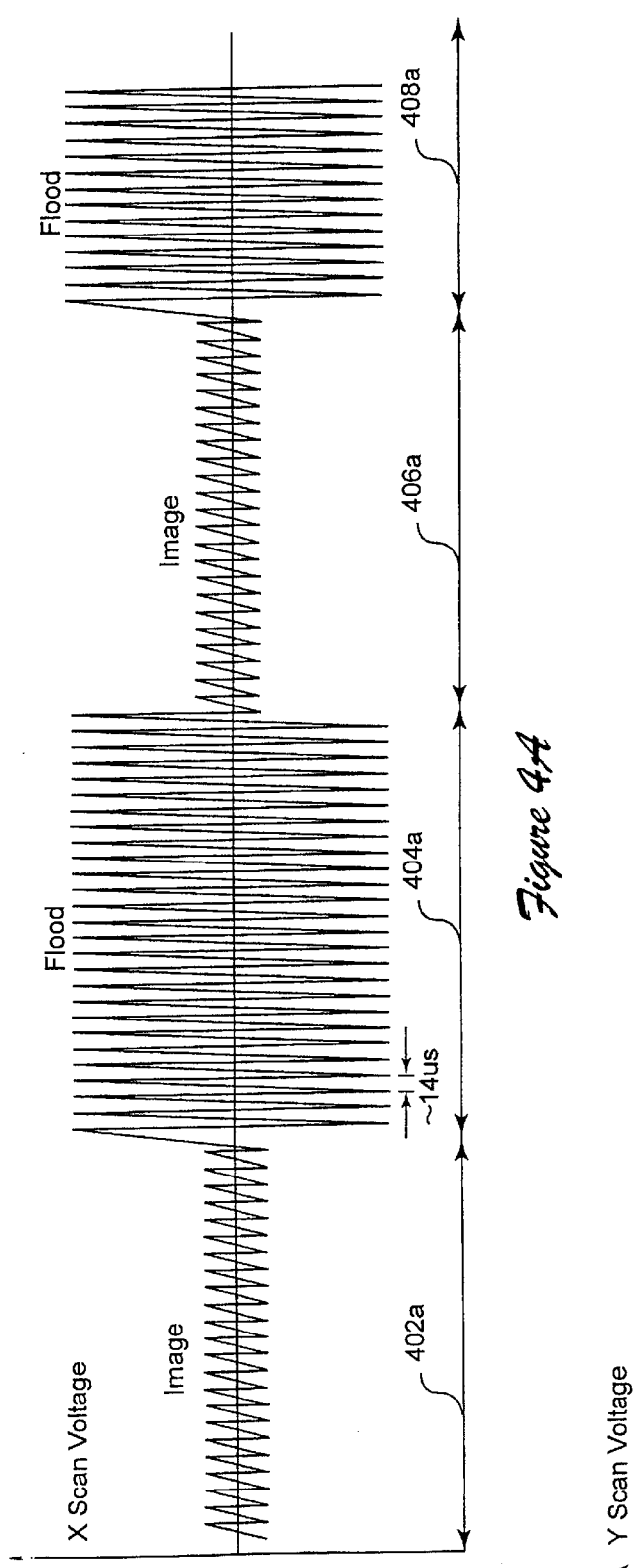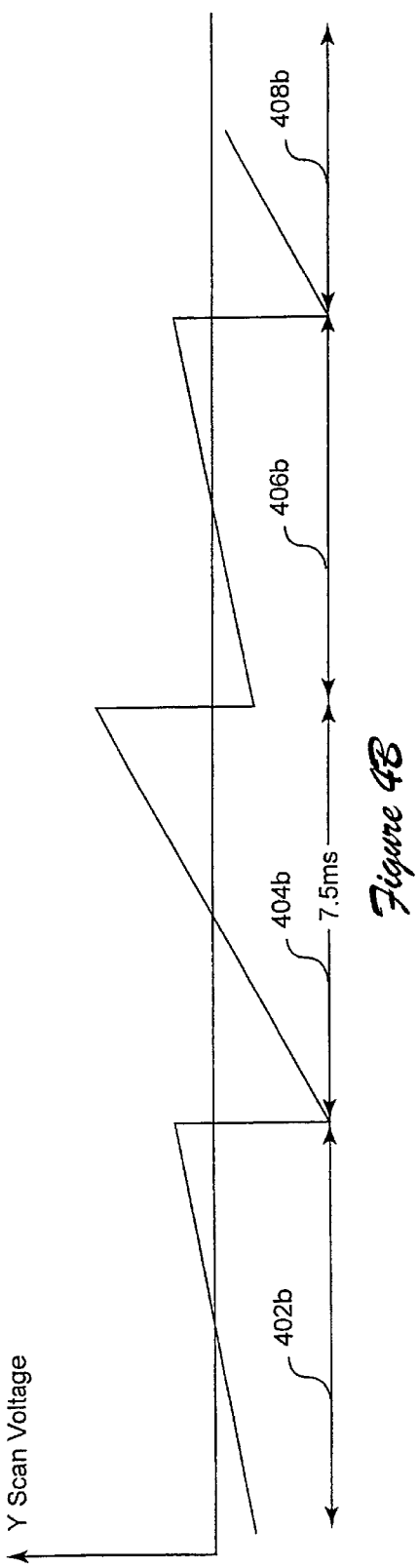

SCANNING ELECTRON BEAM MICROSCOPE

This is a continuation of application Ser. No. 09/149,767 filed Sep. 8, 1998, now U.S. Pat. No. 6,066,849.

BACKGROUND OF THE INVENTION

The present invention relates generally to feature measurement in scanning electron microscopy, and more specifically to apparatus and methods for enhancing image quality. The present invention may also be applied to feature measurement and image enhancement in similar instruments.

FIG. 1 is a diagrammatic representation of a conventional scanning electron microscopy configuration 100. As shown, a beam of electrons 102 is scanned over a specimen 104 (e.g., a semiconductor wafer). Multiple raster scans 112 are typically performed over a small area 114 of the specimen 104. The beam of electrons 102 either interact with the specimen and cause an emission of secondary electrons 106 or bounce off the specimen as backscattered electrons 106. The secondary electrons and/or backscattered electrons 106 are then detected by a detector 108 that is coupled with a computer system 110. The computer system 110 generates an image that is stored and/or displayed on the computer system 110.

Although conventional microscopy systems and techniques typically produce images having an adequate level of quality under some conditions, they produce poor quality images of the specimen for some applications. For example, on a specimen made of a substantially insulative material (e.g., a semiconductor material), performing multiple scans over a small area sometimes causes the specimen to accumulate excess positive charge in the small area relative to the rest of the specimen. The excess charge generates a potential barrier for some of the secondary electrons, and this potential barrier inhibits some of the secondary electrons from reaching the detector 108. Since this excess charge is likely to cause a significantly smaller amount of secondary electrons to reach the detector, an image of the small area is likely to appear dark, thus obscuring image features within that small area.

Additionally, conventional systems and techniques fail to produce images for certain specimen features. For example, the bottom of a contact or trench region is typically undifferentiated from the adjacent sidewalls of the contact or trench. Typically, both the bottom and sidewalls will appear dark because a significant number of the secondary electrons within the contact or trench hit the sidewalls and fail to escape from the contact or trench and reach the detector 108. As a result of this failure, the bottom and sidewall's individual dimensions and shapes are obscured within the resulting image.

Thus, microscopy apparatus and techniques for improving image quality are needed. More specifically, mechanisms for controlling charge distribution on the surface of the specimen are needed.

SUMMARY OF THE INVENTION

Accordingly, the present invention addresses the above problems by providing apparatus and methods for controlling charge distribution on the specimen so as to improve image quality. Charge is controlled by multiplexing an image scanning phase and a setup scanning phase. The image scanning phase may be used to generate an image from the specimen, and the setup phase may be used to control charge that may have resulted from the image scanning phase. While the image phase has operating conditions that are selected to generate an image, the setup phase has operating conditions selected to control charge. Thus, the setup scanning phase has different operating conditions than the image phase such that charge is controlled during the setup phase. The present invention implements multiplexing of one or more values for one or more of the following operating conditions: scanning area, landing energy, beam current density, and scan pattern.

In one embodiment, a method of generating an image of a specimen with a scanning electron microscope (SEM) is disclosed. The SEM has a source unit for directing an electron beam substantially towards a portion of the specimen, a detector for detecting particles that are emitted from the specimen, and an image generator for generating the image of the specimen from the emitted particles. The image features are controlled by conditions under which the image is generated.

The specimen is scanned under a first set of conditions to generate a first image during a first image phase. The specimen is then scanned under a second set of conditions during a setup phase. The second set of conditions are selected to control charge on the specimen. The specimen is then scanned under the first set of conditions to generate a second image during a second image phase. The features of the second image are controlled by the first and second sets of conditions.

In a specific embodiment, the first set of conditions includes a first landing energy of the electron beam, the second set of conditions includes a second landing energy, and the second landing energy used during the set up phase is selected to improve the second image by increasing or decreasing charge that is built up on the specimen during the first image phase. In one implementation of the invention, the first landing energy and second landing energy are controlled by biasing a support that is positioned adjacent to the specimen.

In another specific embodiment, the first set of conditions includes a first current density of the electron beam, the second set of conditions includes a second current density, and the second current density used during the set up phase is selected to improve the second image by increasing or decreasing a rate at which the second image phase may be conducted. In yet another embodiment, the first set of conditions includes a first scan pattern of the electron beam over the specimen, the second set of conditions includes a second scan pattern over the specimen, and the second scan pattern is selected to improve an image quality parameter (e.g., resolution, contrast, signal to noise ration, and/or topology information content) of the second image by controlling charge distribution on the specimen. For example, a scan pattern may be a circular pattern as opposed to a raster scan pattern.

In an apparatus aspect of the invention, a scanning electron microscope (SEM) for generating an image from a specimen is disclosed. The SEM includes an electron beam generator arranged to generate and control an electron beam that is directed substantially towards the specimen and to receive an image control signal that indicates a parameter setting of the electron beam. The SEM also includes a detector arranged to detect charged particles emitted from the specimen to allow generation of an image from the detected charged particles.

The SEM further includes a multiplexer control system arranged to receive a first input signal, a second input signal, and a phase control signal that indicates an image phase or a setup phase. The multiplexer control system is further arranged to output the image control signal to the electron beam generator. The image control signal is based on the first input signal when the phase control signal indicates the image phase, and the image control signal is based on the second input signal when the phase control signal indicates the setup phase.

In another aspect, a method of generating an image of a high-aspect ratio feature of a specimen using a scanning electron microscope (SEM) is disclosed. The SEM has an electron beam generator for generating an electron beam that is configurable to direct the electron beam across the specimen in various scan patterns. The feature has a first wall portion that has a position that is not aligned with a second wall portion.

A first electron beam is scanned in a pattern on the specimen to generate a charge distribution on the specimen proximate the feature such that charge is controlled on the first wall portion so as to control a trajectory of emitted particles near the first wall portion. A second electron beam is scanned across the feature to generate an image of the feature, wherein the charge distribution bends the trajectories of secondary electrons generated during the scanning out of the high-aspect ratio feature.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIGS. 4A and 4B are graphs representing X scan voltage versus time and Y scan voltage versus time, respectively, in accordance with one embodiment of the present invention.

DETAILED DESCRIPTION OF THE PREFERRED EMBODIMENTS

Reference will now be made in detail to the specific embodiments of the invention. Examples of the these specific embodiments are illustrated in the accompanying drawings. While the invention will be described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
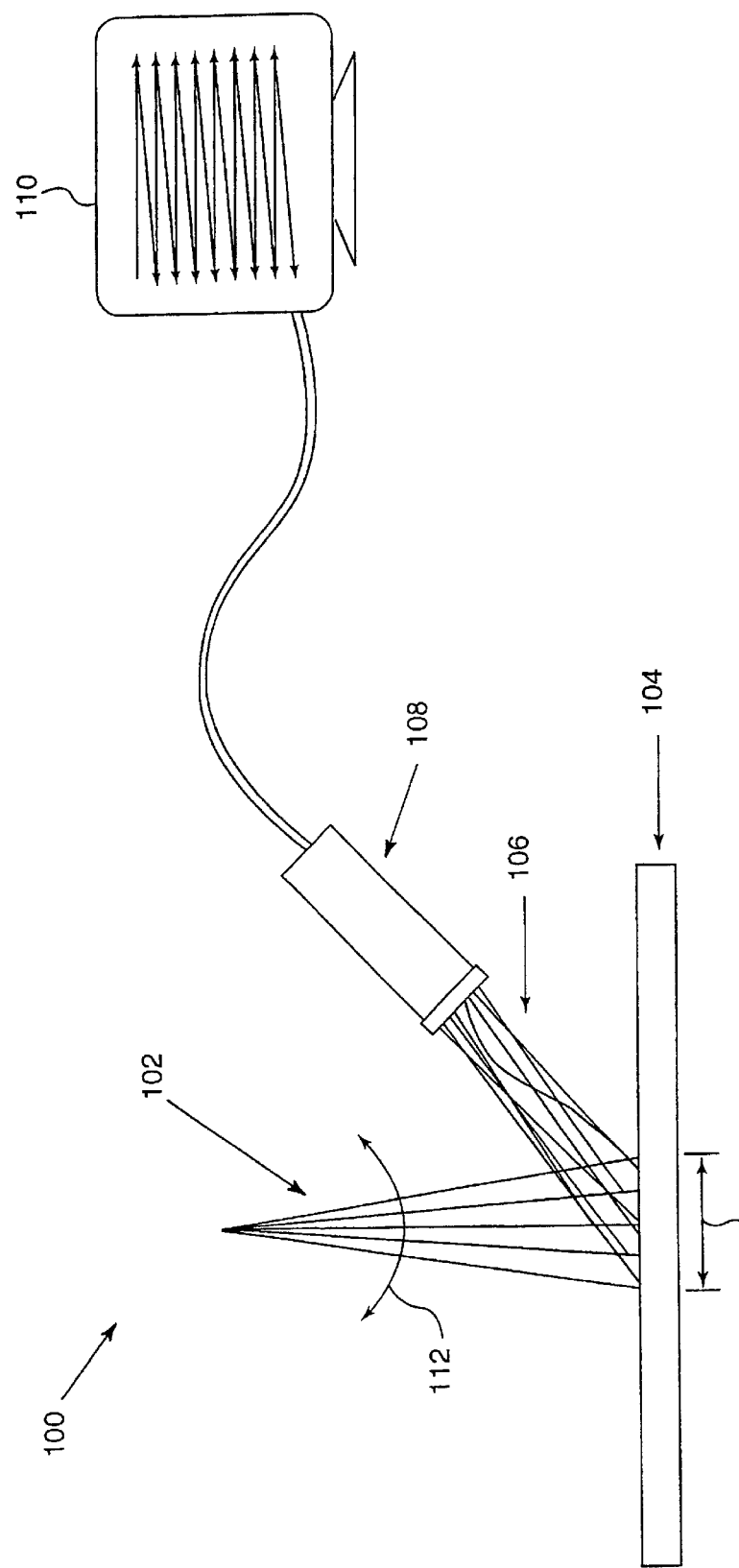
FIG. 1 is a diagrammatic representation of a conventional scanning electron microscopy configuration.
Figure 2A:
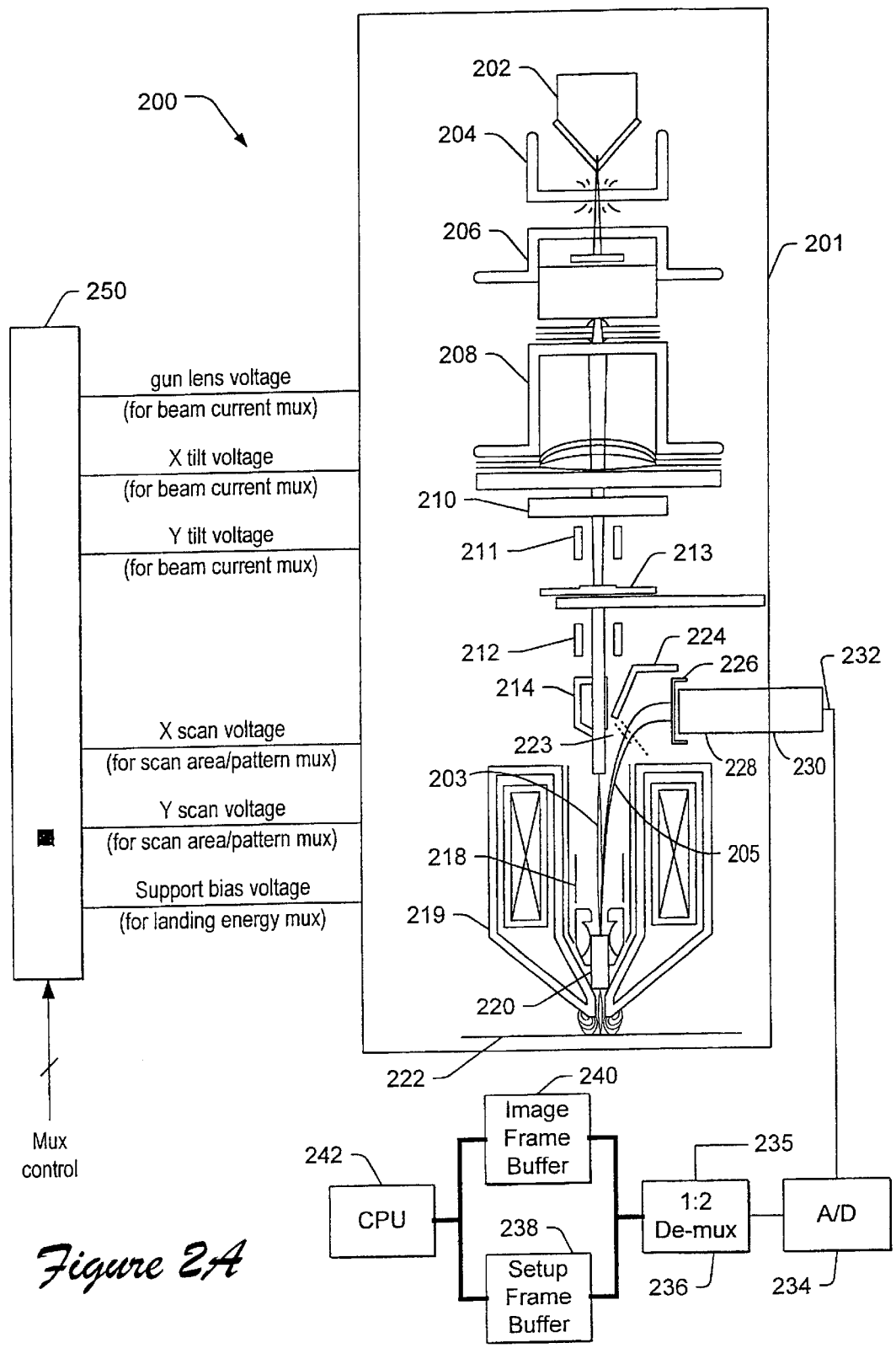
FIG. 2A is a diagrammatic representation of a scanning electron microscope (SEM) system in accordance with one embodiment of the present invention.

FIG. 2A is a diagrammatic representation of a scanning electron microscope (SEM) system 200 in accordance with one embodiment of the present invention. The SEM system 200 includes a multiplexer control system 250 arranged to receive a plurality of multiplexer control signals and to output a plurality of image. control signals to an electron beam generator (202 through 220). Each image control signal affects conditions under which an image is generated by the SEM system 200.

The present invention may include any number or type of image control signals that are suitable for controlling how an image is generated of a portion of a specimen 222. For example, some of the image control signals may affect charge distribution on the specimen 222, and the resulting charge distribution affects how the image is generated. As shown, the image control signals include a gun lens voltage and x and y tilt voltages for controlling beam current density, x and y scan voltages for controlling a scan pattern of the beam, and a support bias voltage for controlling landing energy of the beam. Landing energy is defined as the energy at which the beam hits the specimen. The beam current density, scan pattern, and landing energy affect charge distribution of the specimen 222, and thus, affect how the image is generated.

The electron beam generator (202 through 220) is arranged to receive the plurality of image control signals and to generate an electron beam 203 that is directed substantially toward an area of interest on the specimen 222. The SEM system 200 also includes a detector 224 arranged to detect charged particles 205 emitted from the specimen 222 to allow generation of an image from the detected charged particles, which particles may include secondary electrons and/or backscattered electrons. The electron beam generator is further described below, along with other features of the SEM system 200.

Figure 2B:
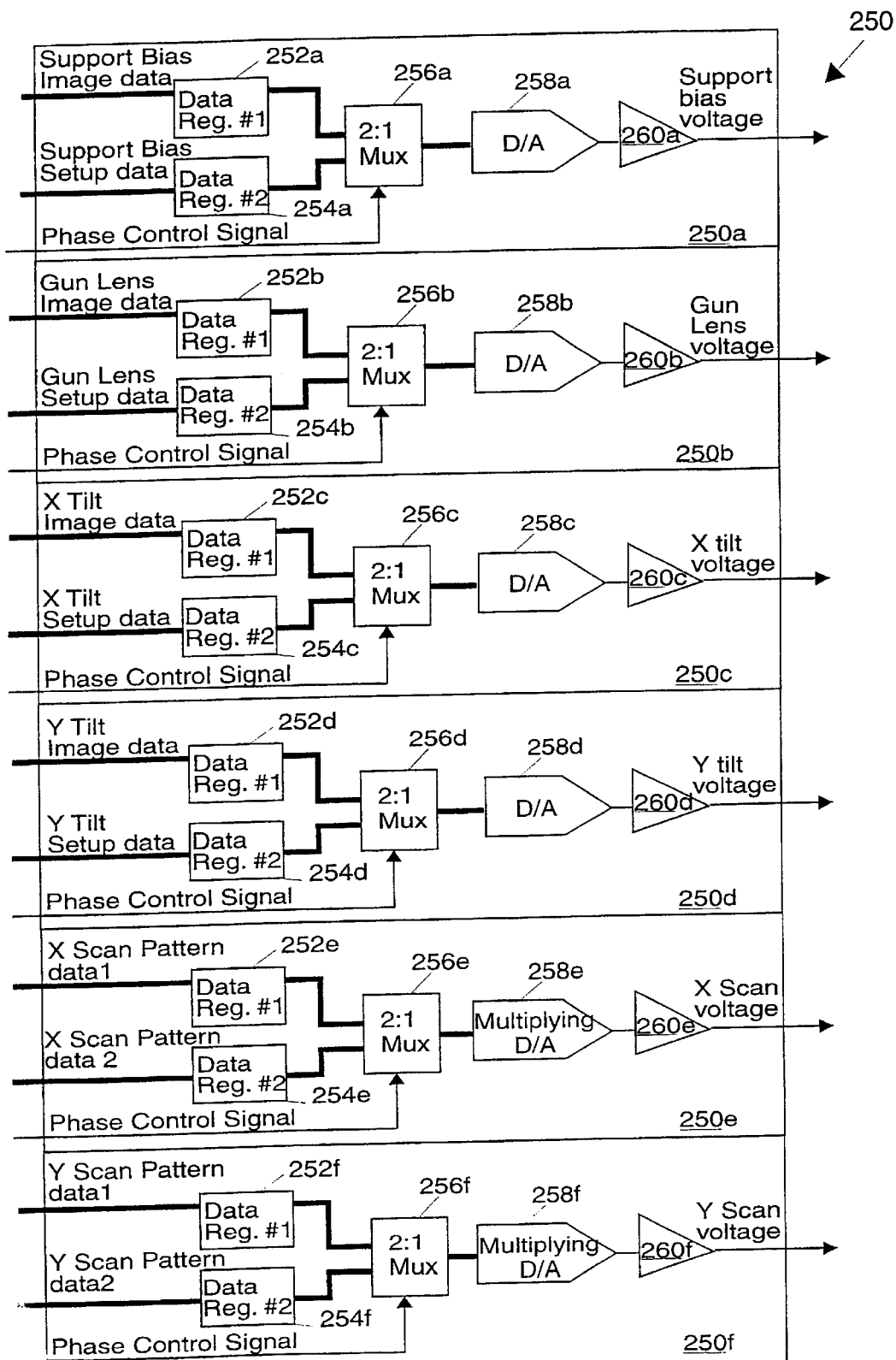
FIG. 2B is a diagrammatic representation of the multiplexer control system of FIG. 2A in accordance with one embodiment of the present invention.

The multiplexer control system 250 may be implemented in any suitable form for multiplexing SEM operating parameters. Additionally, any number of SEM operating parameters may be multiplexed. FIG. 2B is a diagrammatic representation of the multiplexer control system 250 of FIG. 2A in accordance with one embodiment of the present invention.

As shown, the multiplexer control system 250 includes a plurality of multiplexer control blocks 250a through 250f. Each multiplexer control block is arranged to receive a first input signal, a second input signal, and a phase control signal and to output an associated image control signal to the electron beam generator (202 through 220 of FIG. 2A).

For example, multiplexer control block 250a receives support bias image data (e.g., first input signal), support bias setup data (e.g., second input signal), and a phase control signal and outputs a support bias voltage (image control signal) for controlling the landing energy of the beam. The phase control signal indicates whether the support bias voltage at any given time is based on the support bias image data or the support bias setup data.

As shown, each multiplexer control block 250 receives the same phase control signal indicating whether the image control signal is based on the first input signal or the second input signal. Alternatively, each block 250 may receive a distinct phase control signal. In this embodiment, the first input signal, second input signal, and image control signals are different for each multiplexer control block 250. For example, multiplexer control block 250b receives gun lens image data and gun lens setup data as the first and second input signals and outputs a guns lens voltage as the image control signal. Multiplexer control block 250c receives X tilt image data and X tilt setup data and outputs a X tilt voltage. It should be well understood that a "tilt voltage" is a deflection voltage and may include tilt deflection and/or shift deflection. Multiplexer control block 250d receives Y tilt image data and Y tilt setup data and outputs a Y tilt voltage. Multiplexer control block 250e receives X scan pattern data1 and X scan pattern data2 and outputs an X scan voltage, and multiplexer control block 250f receives Y scan pattern data1 and Y scan pattern data2 and outputs an Y scan voltage.

Any suitable configuration for multiplexing between one or more input signals (e.g., support bias image data and support bias setup data) to generate one of the image control signals (e.g., support bias voltage) may be used to implement each control block 250. As shown, each control block 250 includes a first data register 252, a second data register 254, a multiplexer 256, and a digital to analog converter (DAC) 258 or multiplying DAC (e.g., 258e and 258f), and an amplifier 260.

The first data register 252 is arranged to receive the first input signal, and the second data register 254 is arranged to receive the second input signal. The multiplexer 256 is arranged to select either the first or second input signal in response to the phase control signal. By way of example, multiplexer 256a selects either support bias image data or support bias setup data based on the phase control signal. The DAC 258 and amplifier 260 are arranged to convert the data from a digital signal to an analog image control signal that is output to the electron beam generator (202 through 220).

As described, image control signals that affect charge distribution of the specimen 222 are multiplexed. The resulting charge distribution, in turn, affects how the image is generated. For example, during a first image phase, the specimen 222 is scanned under a first set of conditions, which are set by image control signals; during a setup phase, the specimen 222 is then scanned under a second set of conditions, which are set by image control signals; and during a second image phase, the specimen is then scanned again under the first set of conditions. During the second image phase, the charge distribution of the specimen 222 depends on the first set of conditions, as well as the second set. Thus, since image generation is affected by the charge distribution and the charge distribution is the result of the previous and present conditions, the image that is generated during the second image phase also depends on the second set of conditions that are selected to control charge, as well as the first set of conditions that are selected to generate the image.

The image control signals and resulting conditions may be multiplexed in any suitable manner for controlling charge distribution of the specimen 222. FIGS. 3A through 3D are timing diagrams that illustrate techniques for multiplexing SEM operating conditions in accordance with one embodiment of the present invention. One embodiment of an SEM system 200 for implementing the multiplexing of FIGS. 3A through 3D was described above in reference to FIGS. 2A and 2B. Techniques for implementing this multiplexing are further described below in reference to FIGS. 4A through 6D.

Figure 3A:
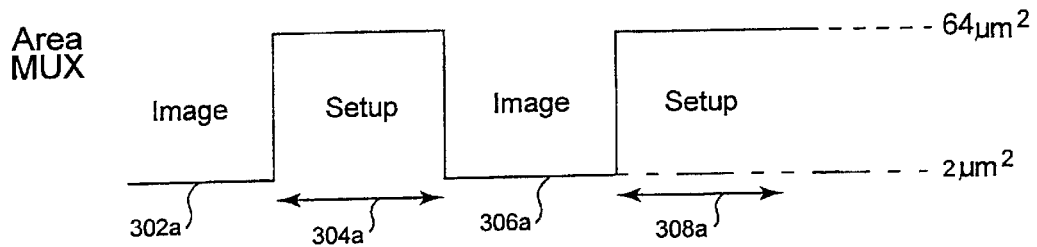
FIGS. 3A through 3D are timing diagrams that illustrate techniques for multiplexing SEM operating conditions in accordance with one embodiment of the present invention.
Figure 3B:
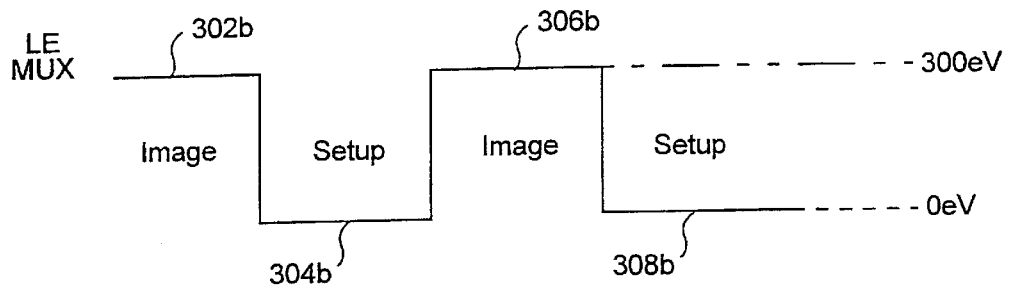
Figure 3C:
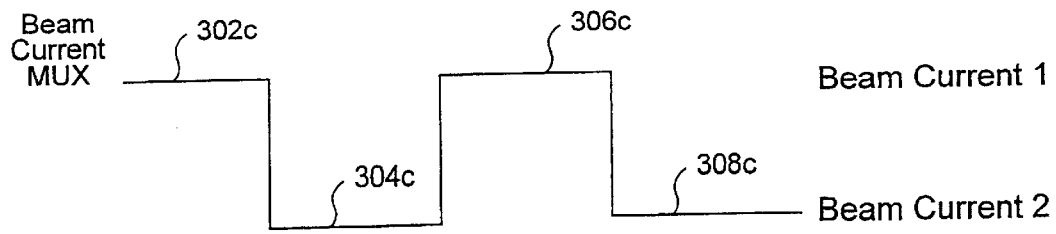
Figure 3D:
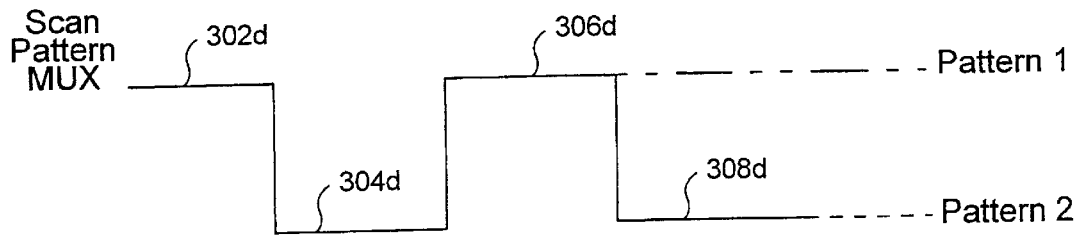

As shown in FIG. 3A, two different scanning areas are multiplexed such that a first area 2 $\mu m^2$ is interleaved with a second area 64 $\mu m^2$. In other words, during a first frame 302a the first area 2 $\mu m^2$ is scanned, then during a second frame 304a a second area 64 $\mu m^2$ is scanned, during a third frame 306a the first area 2 $\mu m^2$ is scanned again, and the these scans are repeated. As shown in FIG. 3B, two different landing energy values are multiplexed such that a first landing energy 300 eV is interleaved with a second landing energy 0 eV. As shown in FIG. 3C, two different beam current density values are multiplexed such that a first beam current density is interleaved with a second beam current density. As shown in FIG. 3D, two different scan patterns are multiplexed such that a first scan pattern is interleaved with a second scan pattern.

One or more of the above described SEM operating conditions (also, referred to as "image conditions") may be multiplexed separately or together. For example, a first landing energy and a first beam current density may be applied during the first frame, and a second landing energy and a second beam current density during a second flame. Alternatively, a first landing energy may be applied during a first frame, a first beam current density during a second frame, a second landing energy during a third frame, and a second beam current density during a fourth frame. In sum, any suitable combination of operating conditions may be multiplexed during any combination of frames such that charge is controlled on the specimen.

As shown in FIG. 3A, the electron beam may be configured to scan different sized areas of the specimen 222 during different time periods by multiplexing different combinations of X and Y scan voltages. For example, a small area (e.g., 2 $\mu m^2$) is scanned during a first image phase 302a to generate an image of the small area. A relatively larger area (e.g., 64 $\mu m^2$), which may include the small area, is then scanned during a first setup phase to control charge distribution on the specimen 222. After the first setup phase, the small area is scanned again during a second image phase 306a to generate the image of the small area. Successive images are typically averaged together to create a final image of the small area. By way of example, 64 frames are typically averaged together to create the final image.

On a specimen formed from substantially insulative material (e.g., a semiconductor or semiconductor oxide or nitride), each scan may result in the release of secondary electrons, increasing the positive charge of the area of interest with each scan. As a result of repeated scans, the small area (e.g., the image area) acquires a higher positive charge than the surrounding area of the specimen 222. This positive charge accumulation may form a significant potential barrier to secondary electrons and result in fewer secondary electrons reaching the detector. Thus, the small area may appear dark within the image. Depending on the level of positive charge on the small area relative to the large area, features of the small area may be difficult to discern in the image.

The techniques of the present invention may alleviate this darkened image problem by alternately scanning the small area and scanning (or "flooding") the large area of the specimen 222. Flooding the large area effectively reduces the voltage differential between the small area to be imaged and the large area, thus reducing the potential barrier for the secondary electrons and allowing them to escape from the imaged small area. The overall charge that builds up on specimen 222 while imaging each small area may be adjusted by changing the ratio between the number of time periods (or "frame") in which only the small image area is scanned versus the number of frames during which the large area is scanned or flooded.

FIGS. 4A and 4B are graphs representing X scan voltage versus time and Y scan voltage versus time, respectively, in accordance with one embodiment of the present invention. As shown in FIG. 4A, the X scan voltage oscillates between a first pair of voltage values during the image phases (402a and 406a) and oscillates between a second pair of voltage values for the setup phases (404a and 408a. The second pair of values have a significantly larger magnitude than the first pair. As a result of this difference, the electron beam scans over a larger X linear region of the specimen during the setup phase than during the image phase.

As shown in FIG. 4B, the Y scan voltage gradually changes from a first value to a second value during the image phases (402b and 406b) and from a third value to a second value during the setup phases (404b and 408b). The difference between Y scan voltages for the setup phase is significantly greater than for the image phase. As a result of this difference between the image and setup phase, the electron beam scans over a larger Y linear region of the specimen during the setup phase, as compared with the image phase. When the Y scan voltage and X scan voltage are varied simultaneously as described, the electron beam scans a larger area of the specimen during the setup phase, as compared with the image phase.

Referring back to FIG. 3B, the electron beam may also be configured to have different landing energy Values during different time periods (e.g., frames) by multiplexing different support bias voltages (e.g., this multiplexing function is implemented by the multiplexer control block 250a of FIG. 2B). As shown, the landing energy has a 300 eV value during an image phase (e.g., 302b and 306b), and about a 0 eV value during a setup phase (e.g., 304b and 308b).

Figure 5:
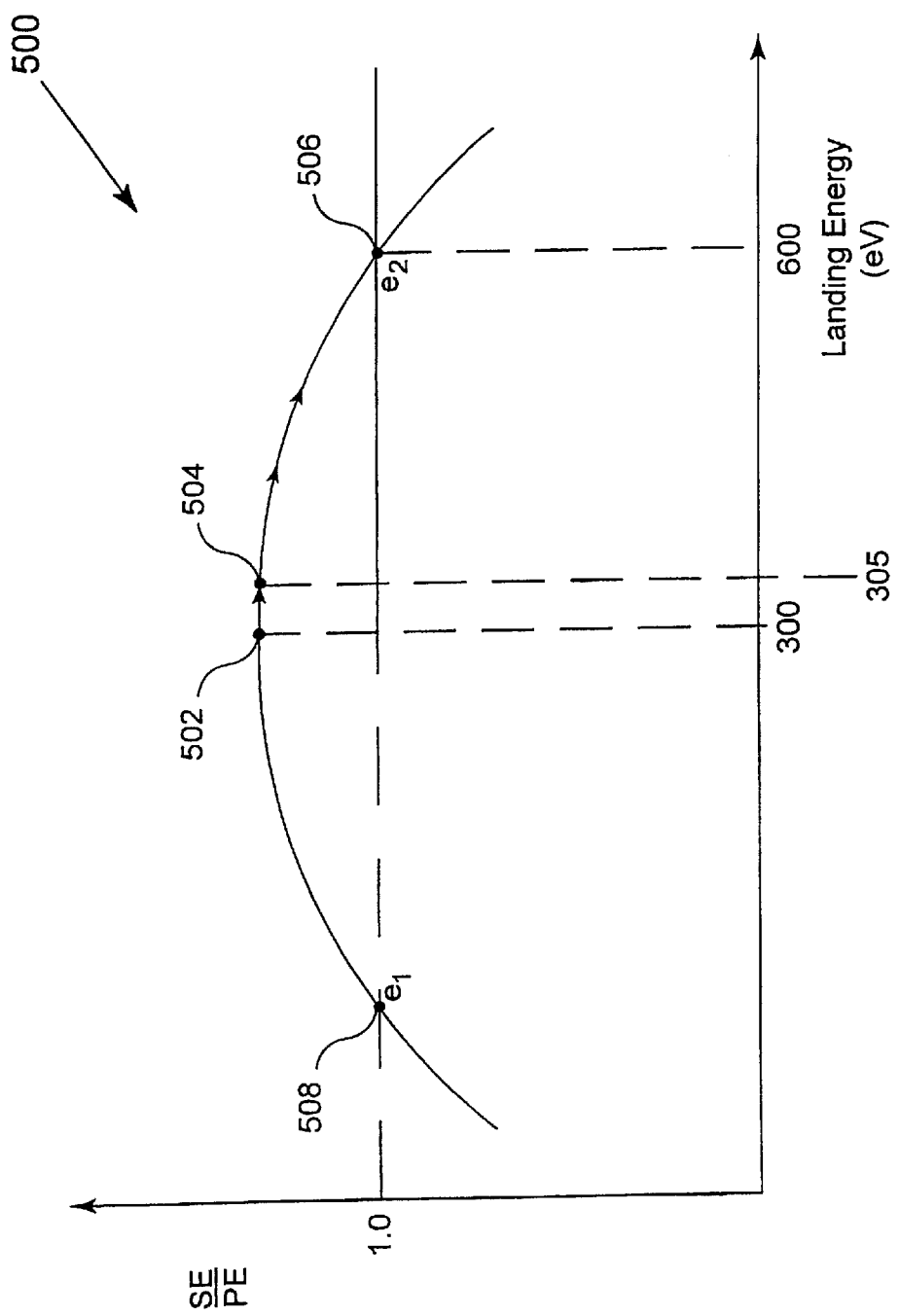
FIG. 5 is a graph representing a ratio of secondary electrons (SE) over primary electron (PE) versus landing energy in accordance with one embodiment of the present invention.

FIG. 5 is a graph 500 representing a ratio of secondary electrons (SE) over primary electron (PE) versus landing energy in accordance with one embodiment of the present invention. Primary electrons are defined as those electron in the electron beam that is directed at an area of the specimen, and the secondary electron are defined as the electrons that escape from the specimen as a result of the primary electrons interacting with the specimen. Setting a particular landing energy results in a particular operating point on the graph 500. By way of example, a landing energy of about 600 electron volts (eV) results in a value of 1.0 for the ratio of SE/PE. At 600 eV, the number of emitted secondary electrons equals the number of primary electrons within the electron beam.

Theoretically, when the number of secondary electrons equals the number of primary electrons (e.g., SE/PE=1.0), charge does not build-up on the specimen. The graph 500 includes two points that are located at unity, commnonly referred to as "e1" 508 and "e2" 506. Thus, if the SEM were configured to have a landing energy of about 600 eV, for example, the ratio of SE/PE has a value of "1.0" at the e2 point 506.

Unfortunately, it is difficult and impractical to set and maintain an SEM landing energy at e2. However, when the SEM operates at a landing energy that corresponds to a nonunity value for SE/PE, charge is accumulated on the specimen. If a landing energy is chosen such that the ratio SE/PE has a value that is more than one (e.g., 300 eV), positive charge accumulates on the specimen. In contrast, if a landing energy is selected such that SE/PE have a value that is below unity(e.g., landing energy about equal to 0 eV), a negative charge accumulates.

The present invention takes advantage of this landing energy and charge accumulation correlation by multiplexing different landing energy values to control charge accumulation on the specimen. The landing energies during setup and image phases are chosen to lie on opposite sides of the unity line for SE/PE. By way of example, a first landing energy of 300 eV is selected during a first frame to generate an image. The first landing energy 300 eV results in a first operating point 502 on the graph 500. Since the first operating point 502 is above unity, positive charge accumulates, and this positive charge causes the landing energy to increase to 305 eV at point 504, for example. Note that positive charge on the specimen surface accelerates electrons in the electron beam into the specimen, thereby increasing the landing energy.

Without any intervention, the landing energy would continue to increase and move towards point e2 506, for example, as the image was generated from averaging successive frames. Unfortunately, when point e2 is obtained, a net positive charge is likely to be present on the specimen, which charge accumulation may detrimentally affect the image. In other words, the 600 eV landing energy at point e2 is due to the initial setting of 300 eV and the accumulated positive charge build-up of 300 eV. As charge accumulates, dark spots may appear and worsen in the image since fewer secondary electrons can overcome the potential barrier that is generated by the accumulated charge.

The techniques of the present invention provide a mechanism for controlling charge by multiplexing different values of landing energy. For example, the positive charge build-up may be controlled or neutralized by selecting a second landing energy equal to a value that is approximately 0 eV for a second frame. Since the relatively low landing energy results in a negative charge build-up, this negative charge accumulation neutralizes the previously accumulated positive charge. The 300 eV landing energy may be applied again in the third frame without any initial positive charge being present on the specimen. As a result of multiplexing, the landing energy merely oscillates between 300 eV and 305 eV, for example, while generating the image. Thus, since charge accumulation is minimized, the incidence of dark spots due to charge build-up may be significantly reduced.

Alternatively, landing energy multiplexing may be implemented to maintain a specific charge level on an area of the specimen. In other words, as charges builds up at a first landing energy, another landing energy may be utilized to cancel excess charge with an opposite charge build up and maintain a specific non-zero charge level. By way of another alternative embodiment, the techniques of the present invention may be employed to operate at or near the e1 point 508, which entails a relatively low operating eV. By operating at a low eV, destruction of the specimen is likely to be reduced as compared with operating at higher eV.

Referring back to FIG. 3C, the electron beam may be configured to have different beam current density values during different frames by multiplexing different gun lens voltages for controlling beam current density (e.g., the multiplexer control block 250b of FIG. 2B may be used to implement this multiplexing function). As shown, the beam current density has a first value during an image phase (e.g., 302c and 306c), and a second value during a setup phase (e.g., 304c and 308c).

Both a relatively higher beam current density and a lower beam current density have advantages with certain applications. For example, a higher beam current density used in conjunction with a landing energy that accumulates charge will likely result in charge accumulating more quickly than with a lower beam current density. However, a lower beam current density is more likely to result in better image quality. Preferably, a higher beam current density may be used in conjunction with a setup phase landing energy and/or area to speed up the charge control process, and a lower beam current density may be selected during an image phase landing energy and/or area to generate the image. For example, the higher beam current density is used in conjunction with the 0 eV landing energy to quickly neutralize charge build-up, and the lower beam current density is then used with 300 eV to generate the image.

Referring back to FIG. 3D, the electron beam may be configured to scan different patterns on the specimen 222 during different time periods by multiplexing different combinations of X and Y scan voltages (e.g., the multiplexer control blocks 250e and 250f may be implemented). For example, a first pattern is scanned during an image phase (e.g., 302d and 306d), and a second pattern is then scanned during a setup phase (e.g., 304d and 308d). Of course, more than two patterns may be multiplexed.

Different scan patterns may be multiplexed across high aspect ratio features of the specimen to control charge distribution along sidewalls of these features. It appear that charge distribution along sidewalls of high aspect ratio features depends on, among other factors, the direction that the electron beam is scanned across a face of the sidewall and the speed with which the beam moves across the feature.

Figure 6A:
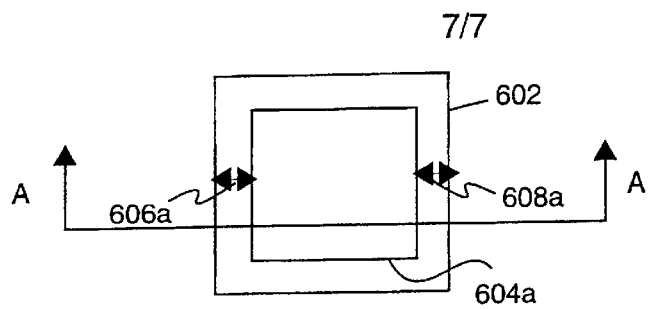
FIG. 6A is a diagrammatic top view of a through-hole on a specimen.
Figure 6B:
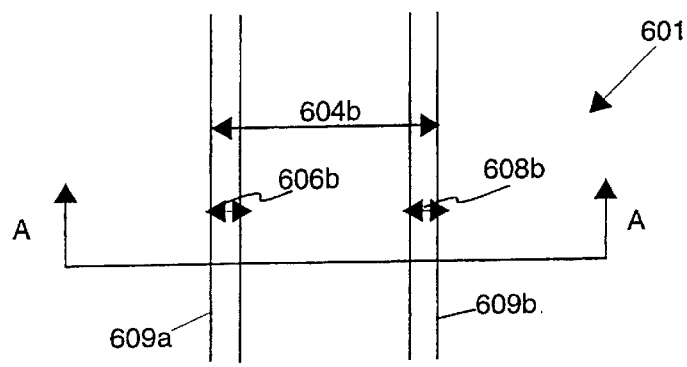
FIG. 6B is a diagrammatic top view of a trench.

Two examples of high aspect ratio features are illustrated in FIGS. 6A and 6B. FIG. 6A is a diagrammatic top view of a through-hole 600 on a specimen. As shown, the through-hole 600 has a bottom surface 604a that is surrounded by sidewalls (e.g., 606a and 608a) that slope up to the top surface 602. Likewise, FIG. 6B is a diagrammatic top view of a trench 601. As shown, the trench includes a bottom surface 604b between two adjacent sidewalls 606b and 608b that slope up to the top surface 609.

Figure 6C:
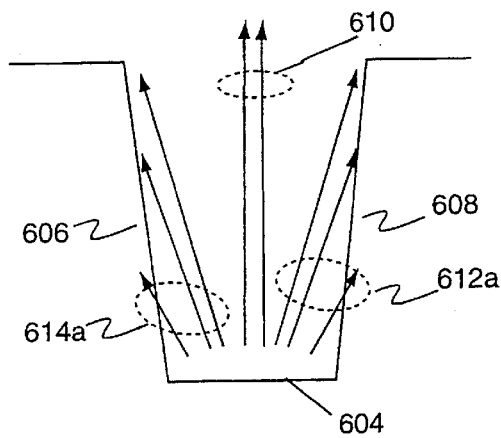
FIG. 6C is a diagrammatic side view of both the through-hole and trench of FIGS. 6A and 6B taken along line A—A prior to scan pattern multiplexing.

FIG. 6C is a diagrammatic side view of both the through-hole 600 and trench 601 of FIGS. 6A and 6B taken along line A—A prior to scan pattern multiplexing. As shown, after the electron beam is scanned over the through hole 600 or trench 601, secondary electrons are emitted from the bottom surface 604. Some of the electrons 610 have a trajectory that is normal to the bottom 604, and these electrons 610 escape out of the through-hole or trench and reach the detector of the SEM. However, some of the electrons 612a and 614a have trajectories angled with respect to the bottom 604 and fail to escape since their trajectories are intersected by a portion of the sidewalls 606 or 608. These electrons 612a and 614a are consequently not detected by the detector. As a result, the image of the through-hole or trench may appear dark. For example, the sidewalls 606 and 608 and bottom surface 604 may both appear dark and indistinguishable from each other.

However, it appears that the present invention provides a mechanism for clearly imaging the bottom surface and sidewalls of the high aspect ratio features. By multiplexing scan patterns that vectors the electron beam across the sidewalls of the high aspect features at variable rates and/or landing energy values, charge may be distributed along the sidewall in a graduated manner. That is, the electron beam is moved normal to the sidewall at variable rates and/or landing energy values such that more charge is accumulated near the top surface of the through-hole or trench sidewalls than near the bottom of the sidewalls. The charge that is distributed along the sidewalls may have any suitable graduation of voltage magnitude values so as to assist secondary electrons into escaping from the bottom of the feature so that high contrast images of the sidewalls and bottom may be generated.

Figure 6D:
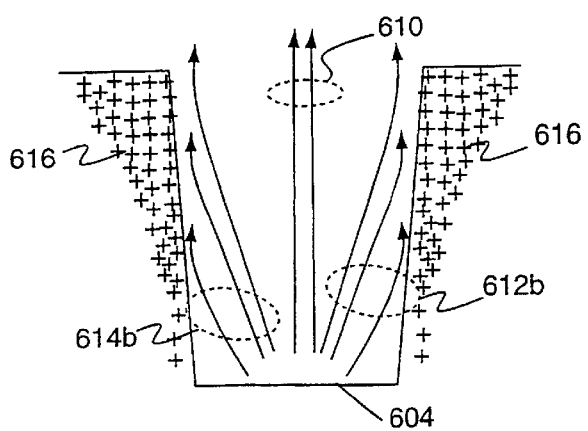
FIG. 6D is a diagrammatic side view of both the through-hole and trench of FIGS. 6A and 6B taken along line A—A after scan pattern multiplexing.

FIG. 6D is a diagrammatic side view of both the through-hole 600 and trench 601 of FIGS. 6A and 6B taken along line A—A after scan pattern multiplexing. As shown, charge 616 is accumulated along the sidewalls in a graduated manner. This graduation of positive charge seems to change the trajectories of the secondary electrons and cause a significantly higher number of secondaries to escape than without scan pattern multiplexing. As shown, the trajectories of electrons 614b and 612b are directed up the sidewall, rather than into the sidewall as shown in FIG. 6C. In effect, the charged sidewall appear to act as a micro-lens that accelerate the secondary electrons out of the through-hole or trench. Thus, scan pattern multiplexing appears to result in a clearer image, wherein the bottom surface 604 of the through-hole 600 or trench 601 is clearly distinguishable from the sidewalls 606 and 608.

Alternatively, scan pattern multiplexing may be utilized to accumulate a negative charge along a sidewall of a step-shaped feature of the specimen. The negative charge may act to deter secondary electrons from hitting the sidewall. As a result, a significantly smaller amount of secondary electrons are likely to hit the negatively charged sidewall. Thus, more secondary electrons are likely to reach the detector, as compared to scanning without multiplexing.

Returning to FIG. 2A, specific details of the SEM system 200 in accordance with one embodiment will now be described. As described above, the SEM system 200 includes a multiplexer control system 250 arranged to receive a plurality of multiplexer control signals and to output a plurality of image control signals to an electron beam generator (202 through 220).

The electron beam generator may be arranged in any suitable configuration for generating an electron beam that will result in secondary electrons being emitted from the specimen 222. As shown, the electron beam generator includes an electron source unit 202, a suppressor 204, an extractor 206, an electrostatic lens 208, an aperture 213, a gun valve 210, an upper quadrupole 211, a lower quadrupole 212, a faraday cup 214, a Wien filter 218, a magnetic lens 219, and a lower octupole 220.

The source unit 202 may be implemented in any suitable form for generating and emitting electrons. For example, the source unit 202 may be in the form of a filament that is heated such that electrons within the filament are excited and emitted from the filament. The suppressor 204 may be configured in any suitable form for inhibiting spurious electrons that deviate from a direct path to the specimen 222. For example, the suppressor 204 may include a hole around which a negative potential is generated to repel the electrons to follow a trajectory that is substantially through a center of the hole.

The extractor 206 may be arranged in any suitable configuration for generating a large positive potential field to slow down the beam electrons and accelerate the secondary electrons away from the specimen. For example, the extractor 206 may be in the form of a large positive electrode for accelerating the beam electrons through a hole in the extractor 206, wherein an extraction field is thrown out from the hole towards the specimen, which field causes the beam electrons to slow down. In contrast, the extraction field causes any secondary electrons that reach it to accelerate away from the specimen. The extractor 206 may also include a beam stop aperture for selecting beam electrons with a small angle with respect to a longitudinal axis through the hole of the extractor 206.

The electrostatic lens 208 may have any suitable configuration for directing the electrons toward the specimen 222. For example, it may be in the form of one or more electrodes. Each electrode has a hole around which field lines are generated that produce a lensing effect and converges the electron beam into a particular cross-over or focal point. The field line's strength and resulting position of the cross-over point depend on the value of the gun lens voltage that is provided by the multiplexer control system 250.

The aperture 213 forms a hole through which the beam is directed. The beam current density depends on the relative placement of the cross-over point with respect to the aperture 213. For example, if the cross-over point is located at the aperture 213, the beam current density is maximized. Thus, the beam current density may be selected by providing a value for the gun lens voltage to the electrostatic lens 208. By selecting a particular gun lens voltage, a particular cross-over point with respect to the aperture 213 is selected, which results in a particular beam current density value.

The upper quadrupole 211 is configured to align the beam after a particular gun lens voltage is selected. In other words, the beam may have to be moved such that it is realigned with respect to the aperture. This realignment is accomplished by supplying an X and Y tilt voltage from the multiplexer control system 250. Thus, to select a beam current density, three image control signals may be provided from the multiplexer control unit 250. That is, the cross-over point's distance from the aperture is selected by setting the gun lens voltage that is supplied to the electrostatic lens 208, and the beam may be realigned with respect to the aperture by setting the X and Y tilt voltage values that are supplied to the upper quadrupole 211.

The lower quadrupole 212 may be included to compensate for mechanical alignment discrepancies. That is, the lower quadrupole 212 is used to adjust the alignment of the beam with respect to any misaligned through-holes of the SEM through which the beam must travel.

The faraday cup 214 may be implemented to collect a sample of the beam current. This component may be used in conjunction with multiplexing the beam current density to check whether the beam current density equals the expected value. Thus, the beam current density may be readjusted to the desired beam current density based on the measured beam current.

The Wien filter 218 provides a BxE field (e.g., a magnetic field's direction is perpendicular and directed away from a direction of an electric field) that is normal to the electron beam is path. The Wien filter 218 applies an E force on the beam that is opposite to the B force that is applied on the beam. Thus, the Wien filter does not substantially move the beam off axis. However, the Wien filter 218 applies the E force and B force on secondary electrons emitted from the specimen in a same direction that is towards the detector 224. Thus, the Wien filter 218 deflects secondary electrons towards the detector 224.

The lower octupole 220 may be configured to direct the beam across an area of the specimen. By setting the X and Y scan voltages, a particular beam pattern may be selected. Thus, to multiplex scan patterns, particular X and Y scan voltage sequences are provided by the multiplexer control unit 250. That is, a first set of X and Y scan voltages are selected, and a second set of X and Y voltages are then selected. In sum, area and/or scan pattern multiplexing may be accomplished by sequencing through appropriate values for the X and Y scan voltages.

The SEM system 200 may include a support (not shown) for supporting the specimen 222. The landing energy multiplexing of the present invention may be accomplished by biasing the support, with the support bias voltage being provided by the multiplexer block 250a, for example. That is, the support is biased at a first value during the image phase, and at a second value for the setup phase. Alternatively, the landing energy may be multiplexed by biasing the electron source unit 202. Of course, the settings of the electron beam generator is components may then have to be readjusted to align the beam.

The SEM system 200 may include an energy filter and ground mesh 223, a scintillator 226, and detector 228 and 230. The energy filter and ground mesh 223 may be arranged to select between secondary and backscattered electrons. If a high negative potential is applied to the energy filter 223, it is likely that backscattered electrons will only reach the detector 228 and 230 since backscattered electrons typically have a much higher eV value than the secondary electrons. The scintillator 226 is arranged to accelerate the electrons that make it past the energy filter and ground mesh 223 towards the detector 228 and 230. For example, the scintillator 226 may be charged to a large positive potential, such as 5000 volts.

Once the electrons are detected by the detector 228 and 230, an image. generator (234 through 242) is arranged to receive the detected signal 232 and generate and/or store an image. The detected signal 232 is used to generate the image. Thus, the SEM system 200 includes an analog to digital converter 234 for converting the detected signal into a digital signal, a demultiplexer 236 for selectively storing the image phase data and the setup phase data in either an image frame buffer 240 or a setup frame buffer 238. The SEM system 200 may also include a computer system 242 for processing the image frame data to generate an image of the specimen. For example, successive image frame data may be averaged together to create the image. Alternatively, the setup frame data may be utilized to generate an image.

Although the invention has been described as being implemented on the SEM system 200 of FIG. 2, of course another SEM system may be implemented. By way of example, the source may expel electron at an eV that is substantially equal to the final landing energy value, and the electrons are then accelerated through a series of lens that are set at large positive potentials. As the electrons are expelled from the series of lens, the electrons then slow down and hit the specimen at the final landing energy. The series of lenses may throw out a large extraction field out of the objective lens, which acts to decelerate the electron beam, while accelerating the secondary electrons that are emitted from the specimen.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, although the scan pattern multiplexing is described as controlling positive charge accumulation along sidewalls of high aspect ratio features, of course, negative charge may also be accumulated. Alternatively, positive or negative charge may be reduced, instead of accumulated. By way of another example, the present invention may practiced to provide many different types of information (e.g., roughness, geometry types, corner rounding of features on the specimen) about the specimen, besides metrology information.

Additionally, the above described multiplexing techniques may be used for automatic defect classification. That is, the defects found by the SEM may be automatically categorized by the SEM system. Also, the specimen may be any substance or object that is suitable for SEM inspection, such as a semiconductor wafer or reticle. By way of a final example, the present invention may be especially useful in inspecting thin film heads within hard disks, which are being designed with smaller and smaller dimensions.

Accordingly, the present embodiments are to be considered as illustrative and not restrictive, and the invention is not to be limited to the details given herein, but may be modified within the scope and equivalents of the appended claims.

What is claimed is:

1. A method of generating an image of a specimen with a scanning electron microscope (SEM) having a source unit for directing an electron beam substantially towards a portion of the specimen, a detector for detecting particles that are emitted from the specimen, and an image generator for generating the image of the specimen from the emitted particles, the image features being controlled by conditions under which the image is generated, comprising:
   scanning the specimen under a first set of conditions to generate a first image during a first image phase;
   scanning the specimen under a second set of conditions during a setup phase that is performed after the first image phase, the second set of conditions being selected to reduce charge build up on the specimen; and
   scanning the specimen under the first set of conditions to generate a second image during a second image phase that is performed after the setup phase, wherein the features of the second image are controlled by the first and second sets of conditions,
   wherein the first set of conditions include at least two conditions selected from a group consisting of a first landing energy, a first beam current density, and a first beam scan area and the second set of conditions include at least two selected from a group consisting of a second landing energy that differs from the first landing energy, a second beam current density that differs from the first beam current density, and a second scan area that has a larger size than the first scan area.

2. A method as recited in claim 1, wherein the first set of conditions include the first landing energy, the first beam current density, and the first scan area and the second set of conditions include the second landing energy, the second beam current density, and the second scan area.

3. A method as recited in claim 2, wherein the first set of conditions further include a first scan pattern and the second set of conditions further include a second scan pattern that differs from the first scan pattern.

4. A method as recited in claim 2, wherein the first set of conditions include the first landing energy and the first beam current density and the second set of conditions include the second landing energy and the second beam current density.

5. A method as recited in claim 2, wherein the first set of conditions include the first landing energy and the first scan area and the second set of conditions include the second landing energy and the second scan area.

6. A method as recited in claim 2, wherein the first set of conditions include the first beam current density and the first scan area and the second set of conditions include the second beam current density and the second scan area.

7. A method as recited in claim 1, further comprising averaging the images generated during the first and second image phases.

8. A scanning electron microscope (SEM) for generating an image from a specimen, comprising:
   an electron beam generator arranged to generate and control an electron beam that is directed substantially towards the specimen and to receive a first image control signal that indicates a parameter setting of the SEM;
   a detector arranged to detect charged particles emitted from the specimen to allow generation of an image from the detected charged particles; and
   a multiplexer control system operable to cause the electron beam generator to:
      scan the specimen under a first set of conditions to generate a first image during a first image phase;
      scan the specimen under a second set of conditions during a setup phase that is performed after the first image phase, the second set of conditions being selected to reduce charge build up on the specimen; and
      scan the specimen under the first set of conditions to generate a second image during a second image phase that is performed after the setup phase, wherein the features of the second image are controlled by the first and second sets of conditions,
   wherein the first set of conditions include at least two conditions selected from a group consisting of a first landing energy, a first beam current density, and a first beam scan area and the second set of conditions include at least two selected from a group consisting of a second landing energy that differs from the first landing energy, a second beam current density that differs from the first beam current density, and a second scan area that has a larger size than the first scan area.

9. An SEM as recited in claim 8, wherein the first set of conditions include the first landing energy, the first beam current density, and the first scan area and the second set of conditions include the second landing energy, the second beam current density, and the second scan area.

10. An SEM as recited in claim 9, wherein the first set of conditions further include a first scan pattern and the second set of conditions further include a second scan pattern that differs from the first scan pattern.

11. An SEM as recited in claim 9, wherein the first set of conditions include the first landing energy and the first beam current density and the second set of conditions include the second landing energy and the second beam current density.

12. An SEM as recited in claim 9, wherein the first set of conditions include the first landing energy and the first scan area and the second set of conditions include the second landing energy and the second scan area.

13. An SEM as recited in claim 9, wherein the first set of conditions include the first beam current density and the first scan area and the second set of conditions include the second beam current density and the second scan area.

14. An SEM as recited in claim 8, further comprising an image generator operable to average the images generated during the first and second image phases.

15. A scanning electron microscope (SEM) for generating an image from a specimen comprising:
- an electron beam generator arranged to generate and control an electron beam that is directed substantially towards the specimen and to receive a first image control signal that indicates a parameter setting of the SEM;
- a detector arranged to detect charged particles emitted from the specimen to allow generation of an image from the detected charged particles; and
- a multiplexer control system operable to cause the electron beam generator to:
  - scan the specimen under a first set of conditions to generate a first image during a first image phase;
  - scan the specimen under a second set of conditions during a setup phase that is performed after the first image phase, the second set of conditions being selected to control charge on the specimen; and
  - scan the specimen under the first set of conditions to generate a second image during a second image phase that is performed after the setup phase, wherein the features of the second image are controlled by the first and second sets of conditions.

16. An SEM as recited in claim 15, wherein the first set of conditions include at least two conditions selected from a first group consisting of a first landing energy, a first beam current density, and a first scan area and the second set of conditions include at least two conditions selected from a second group consisting of a second landing energy that differs from the first landing energy, a second beam current density that differs from the first beam current density, and a second scan area that differs from the first scan area.

17. An SEM as recited in claim 16, wherein the first group further includes a first scan pattern and the second group further includes a second scan pattern that differs from the first scan pattern.

18. A scanning electron microscope (SEM) for generating an image from a specimen, comprising:
- an electron beam generator arranged to generate and control an electron beam that is directed substantially towards the specimen and to receive a first image control signal that indicates a parameter setting of the SEM;
- a detector arranged to detect charged particles emitted from the specimen to allow generation of an image from the detected charged particles; and
- a multiplexer control system operable to cause the electron beam generator to:
  - scan a first electron beam in a pattern on the specimen to generate a charge distribution on the specimen proximate the feature such that charge is controlled on the first wall portion so as to control a trajectory of emitted particles near the first wall portion;
  - scan a second electron beam across the feature to generate an image of the feature, wherein the charge distribution bends the trajectories of secondary electrons generated during in the high-aspect feature out of the high-aspect ratio feature.

19. An SEM as recited in claim 18, wherein the pattern of the first electron beam scanning is selected such that the charge on the first wall is increases in charge value from a bottom of the first wall portion to a top of the first wall portion.

20. An SEM as recited in claim 18, wherein the multiplexer control system is further operable to cause the electron beam generator to scan a third electron beam in a pattern on the specimen to generate a charge distribution on the specimen proximate the feature such that charge is controlled on the first wall portion so as to control a trajectory of emitted particles near the first wall portion.

* * * * *